United States Patent
Hattori et al.

(10) Patent No.: US 7,898,116 B2
(45) Date of Patent: Mar. 1, 2011

(54) INTEGRATED-INVERTER ELECTRIC COMPRESSOR AND INVERTER DEVICE

(75) Inventors: Makoto Hattori, Aichi-ken (JP); Kazuki Niwa, Aichi-ken (JP); Koji Nakano, Aichi-ken (JP); Takashi Nakagami, Aichi-ken (JP); Shunsuke Yakushiji, Aichi-ken (JP); Naoto Kunieda, Aichi-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 240 days.

(21) Appl. No.: 12/230,207

(22) Filed: Aug. 26, 2008

(65) Prior Publication Data
US 2009/0244854 A1 Oct. 1, 2009

(30) Foreign Application Priority Data
Mar. 26, 2008 (JP) ................................. 2008-081853

(51) Int. Cl.
*H02M 1/00* (2007.01)
*H02M 5/00* (2006.01)
(52) U.S. Cl. ........................................ 307/151; 363/147
(58) Field of Classification Search .................. 307/151; 62/228.1; 363/143, 147; 318/801
See application file for complete search history.

(56) References Cited

U.S. PATENT DOCUMENTS

| | | | | |
|---|---|---|---|---|
| 5,649,418 | A * | 7/1997 | Ludwig | 60/801 |
| 7,207,187 | B2 * | 4/2007 | Funahashi et al. | 62/228.4 |
| 7,266,962 | B2 * | 9/2007 | Montuoro et al. | 62/236 |
| 7,561,445 | B2 * | 7/2009 | Yajima et al. | 361/826 |
| 7,652,902 | B2 * | 1/2010 | Hattori et al. | 363/147 |
| 7,688,018 | B2 * | 3/2010 | Goto et al. | 318/599 |

FOREIGN PATENT DOCUMENTS

| JP | 8-322264 A | 12/1996 |
|---|---|---|
| JP | 2004-162618 A | 6/2004 |

* cited by examiner

*Primary Examiner* — Albert W Paladini
(74) *Attorney, Agent, or Firm* — Westerman, Hattori, Daniels & Adrian, LLP

(57) ABSTRACT

The invention provides an integrated-inverter electric compressor and an inverter device thereof which allow handling of the inverter device by neither touching nor holding a CPU substrate. An integrated-inverter electric compressor includes an inverter module integrating a power-related metal substrate on which a power semiconductor switching device is mounted and a resin case integrally insert-molded with a plurality of terminals, and is provided with a CPU substrate on which a control and communication circuit having a device that operates at low-voltage is mounted on the upper surface of the inverter module, wherein the resin case is integrated with a grip which extends in a horizontal direction at an upper edge of a circumference thereof.

5 Claims, 4 Drawing Sheets

INTEGRATED-INVERTER ELECTRIC COMPRESSOR AND INVERTER DEVICE

BACKGROUND OF THE INVENTION

1. Field of the Invention

The present invention relates to an integrated-inverter electric compressor for an in-vehicle air-conditioning apparatus and to an inverter device thereof, the integrated-inverter electric compressor being formed by integrating the inverter device with the outer periphery of a housing accommodating an electric motor and a compressor.

This application is based on Japanese Patent Application No. 2008-081853, the content of which is incorporated herein by reference.

2. Description of Related Art

Recently, various electric compressors having integrated inverters have been proposed for in-vehicle air-conditioning apparatuses. These integrated-inverter electric compressors have an inverter container (inverter box) on the outer circumference of a housing accommodating an electric motor and a compressing mechanism, and an inverter device, provided inside the inverter container, that converts DC power supplied from a high-voltage power supply unit to three-phase AC power and supplies it to the electric motor via a glass sealed terminal. In this way, the rotational speed of the compressor is variably controlled according to the air-conditioning load.

As described in Japanese Unexamined Patent Applications, Publication Nos. HEI-8-322264 and 2004-162618, the inverter is integrated with the outer circumferential section of the compressor housing by providing a power-related substrate (including a platform and unit base) and a CPU substrate (printed circuit board) in two vertical layers. The power-related substrate has a plurality of power semiconductor switching devices (IGBTs) for converting DC power to three-phase AC power. The CPU substrate has a control and communication circuit having a device that operates at low voltage, such as a CPU. The substrates are mounted to the outer circumferential section of the compressor housing by accommodating them inside an external frame.

There is a need for decreasing the size of compressors of in-vehicle air-conditioning apparatuses in order to maintain the ease of mounting in highly dense engine compartments of vehicles. Even for integrated-inverter electric compressors having an integrated inverter device, there is a strong need for decreasing the size of an inverter container including the inverter devices. To fulfill such needs, the inverter device is formed as a module in order to decrease the size of the inverter device and the inverter container and to facilitate assembly.

In such a case, the inverter device is formed by mounting a CPU substrate (printed circuit board) above the power-related metal substrate of an inverter module, the inverter module being formed by integrating a power-related metal substrate on which a bare power semiconductor switching device is mounted and a resin case integrally formed by insert-molding it with a plurality of terminals, a bus bar, and so on.

However, with an inverter device having the above-described configuration, the CPU substrate may be slightly larger than the resin case and may be mounted on the upper surface of the resin case. In such a case, someone might directly touch the CPU substrate and/or hold the CPU substrate when transporting or assembling the inverter device. As a result, there is a risk that the CPU substrate might be damaged, or static electricity might be generated, thus causing damage to the CPU substrate.

BRIEF SUMMARY OF THE INVENTION

The present invention has been conceived in light of the above circumstances, and an object thereof is to provide an integrated-inverter electric compressor and an inverter device thereof which allow handling of the inverter device by neither touching nor holding a CPU substrate.

To achieve the above-described object, an integrated-inverter electric compressor according to the present invention provides the following solutions.

Specifically, an integrated-inverter electric compressor according to the present invention has an inverter container on the outer circumference of a housing accommodating an electric motor and a compressing mechanism and an inverter device, disposed inside the inverter container, for supplying electric power to the electric motor by converting DC power from a high-voltage power source to three-phase AC power, wherein the inverter device includes an inverter module integrating a power-related metal substrate, on which a power semiconductor switching device is mounted, with a resin case in which a plurality of terminals are integrally insert-molded, and is provided with a CPU substrate on which a control and communication circuit having a device that operates at low-voltage, such as a CPU, is mounted on the upper surface of the inverter module, and wherein the resin case is integrated with a grip which extends horizontally at an upper edge of a circumference thereof.

According to the present invention, the CPU substrate is provided on the upper surface of the inverter module integrating the power-related metal substrate of the inverter device and the resin case. Since the grip extending horizontally is integrated with the upper edge of the circumference of the resin case, the inverter device can be handled by persons and/or robots during transportation and assembly by holding the grip extending from the resin case. In this way, the inverter device can be handled without directly touching the CPU substrate or can be held and lifted without holding the CPU substrate. Therefore, damage caused by holding the CPU substrate and damage caused by the generation of static electricity can be prevented. Also, since the strength of the resin case can be increased by providing the grip, the vibration resistance of the inverter device can be improved.

In the above-described integrated-inverter electric compressor according to the present invention, the resin case may be substantially rectangular, U-V-W terminals for supplying three-phase AC power to the electric motor protrude from a first side surface, and the grip is provided at an upper edge of a second side surface opposing the first side surface.

According to the present invention, since the grip is provided at the upper edge on a second side of the resin case opposing a first side surface from which the U-V-W terminals protrude, the inverter device can be handled by holding the U-V-W terminals on the first side surface of the resin case and the grip on the second side surface. Therefore, the inverter device can be handled without directly holding the CPU substrate, thus preventing damage to the CPU substrate.

In the above-described integrated-inverter electric compressor according to the present invention, the grip may be provided along substantially the entire width of the upper edge of the second side surface.

According to the present invention, since the grip is provided along substantially the entire width of the upper edge of the second side surface, the inverter device can be handled by holding a section of the grip, which is provided along substantially the entire width. Therefore, when holding other side surfaces of the resin case, handling is simplified by increasing the length of the section that can be held.

In the above-described integrated-inverter electric compressor according to the present invention, the length of the grip extending in the horizontal direction may be substantially the same as that of the edge of the CPU substrate.

According to the present invention, since the length of the grip extending in the horizontal direction is substantially the same as that of the edge of the CPU substrate, even when a grip extending in the horizontal direction at the upper edge of the circumference of the resin case is provided, the resin case does not become larger than the CPU substrate. Therefore, the size of the inverter device is not increased at all, and the capacity of the inverter container is maintained.

An inverter device according to the present invention is integrated, as a module, with an integrated-inverter electric compressor, the inverter device including an inverter module integrating a power-related metal substrate on which a power semiconductor switching device is mounted and a resin case integrally insert-molded with a plurality of terminals, and being provided with a CPU substrate on which a control and communication circuit having a device that operates at low-voltage, such as a CPU, is mounted on the upper surface of the inverter module, and the resin case being integrated with a grip which extends in a horizontal direction at an upper edge of a circumference thereof.

According to the present invention, the CPU substrate is provided on the upper surface of the inverter module integrating the power-related metal substrate of the inverter device and the resin case. Since the grip extending in the horizontal direction is integrated with the upper edge of the circumference of the resin case, the inverter device can be handled by persons and/or robots during transportation and assembly by holding the grip extending from the resin case. In this way, the inverter device can be handled without directly touching the CPU substrate or can be held and lifted without holding the CPU substrate. Therefore, damage caused by holding the CPU substrate and damage caused by the generation of static electricity can be prevented. Also, since the strength of the resin case can be increased by providing the grip, the vibration resistance of the inverter device can be improved.

With the integrated-inverter electric compressor and the inverter device according to the present invention, the inverter device can be handled by persons and/or robots during transportation and assembly by holding the grip extending from the resin case. In this way, the inverter device can be handled without directly touching the CPU substrate or can be held and lifted without holding the CPU substrate. Therefore, damage caused by holding the CPU substrate and damage caused by the generation of static electricity can be prevented. Since the strength of the resin case can be increased by providing the grip, the vibration resistance of the inverter device can be improved.

DETAILED DESCRIPTION OF THE INVENTION

An embodiment of the present invention will be described below with reference to FIGS. 1 to 4.

Figure 1:
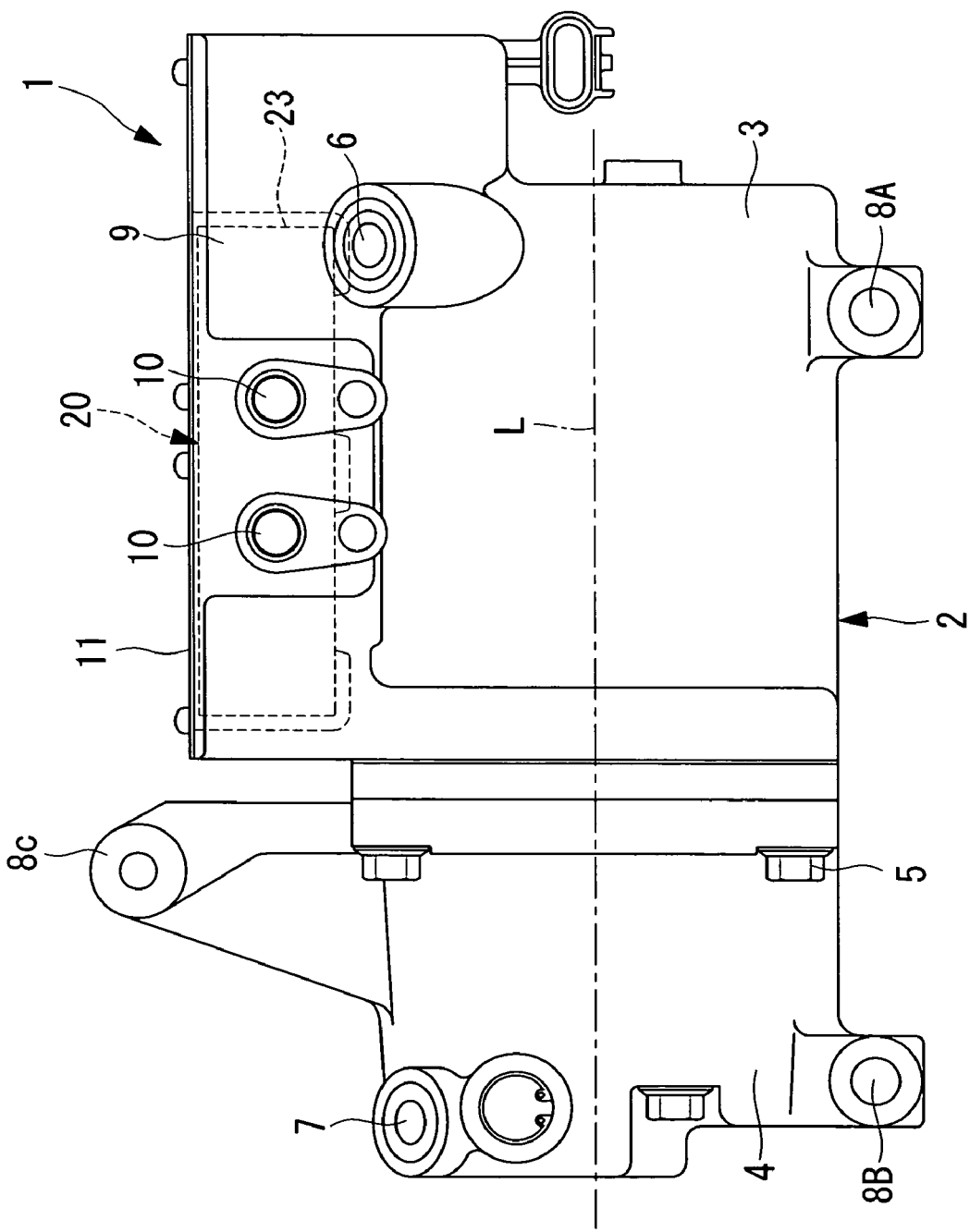
FIG. 1 is an external side view of an integrated-inverter electric compressor according to an embodiment of the present invention.

FIG. 1 illustrates an external side view of an integrated-inverter electric compressor 1 according to an embodiment of the present invention. The integrated-inverter electric compressor 1 includes a housing 2 that forms the outer shell thereof. The housing 2 is constructed by integrating a motor housing 3 for accommodating an electric motor, which is not shown in the drawing, and a compressor housing 4 for accommodating a compressing mechanism, which is not shown in the drawing, by tightening bolts 5. The motor housing 3 and the compressor housing 4 are pressure-resistant containers formed by aluminum die-casting.

The electric motor and the compressing mechanism, which are not shown in the drawing, accommodated inside the housing 2 are linked via a motor shaft, and the compressing mechanism is driven as a result of the electric motor being rotated. A refrigerant suction port 6 is provided at one end (on the right side of FIG. 1) of the motor housing 3, so that low-temperature and low-pressure refrigerant gas drawn from this refrigerant suction port 6 into the motor housing 3 flows around the electric motor in the L direction of the motor shaft and is drawn into the compressing mechanism, where the refrigerant gas is compressed. As a result of being compressed by the compressing mechanism, high-temperature and high-pressure refrigerant gas is discharged into the compressor housing 4 and is expelled to the outside via a discharge port 7 provided at the other end (on the left side of FIG. 1) of the compressor housing 4.

The housing 2 has three mounting legs 8A, 8B, and 8C; for example, one leg is at a lower part at one end (on the right side of FIG. 1) of the motor housing 3, one leg is at a lower part at the other end (on the left side of FIG. 1) of the compressor housing 4, and one leg is at an upper part of the compressor housing 4. The integrated-inverter electric compressor 1 is secured to a vehicle via these mounting legs 8A, 8B, and 8C by affixing it with a bracket and bolts on a side wall, etc. of an engine, which is provided inside the engine compartment of the vehicle.

A box-shaped inverter container 9 is integrally formed at an upper part of the outer circumferential part of the motor housing 3. The inverter container 9 is shaped like a box which has an open top and which is composed of surrounding walls of a certain height. Two power cable outlets 10 are provided on a side surface of the inverter container 9. The top of the inverter container 9 is covered with a lid 11 that is secured with screws.

Figure 2:
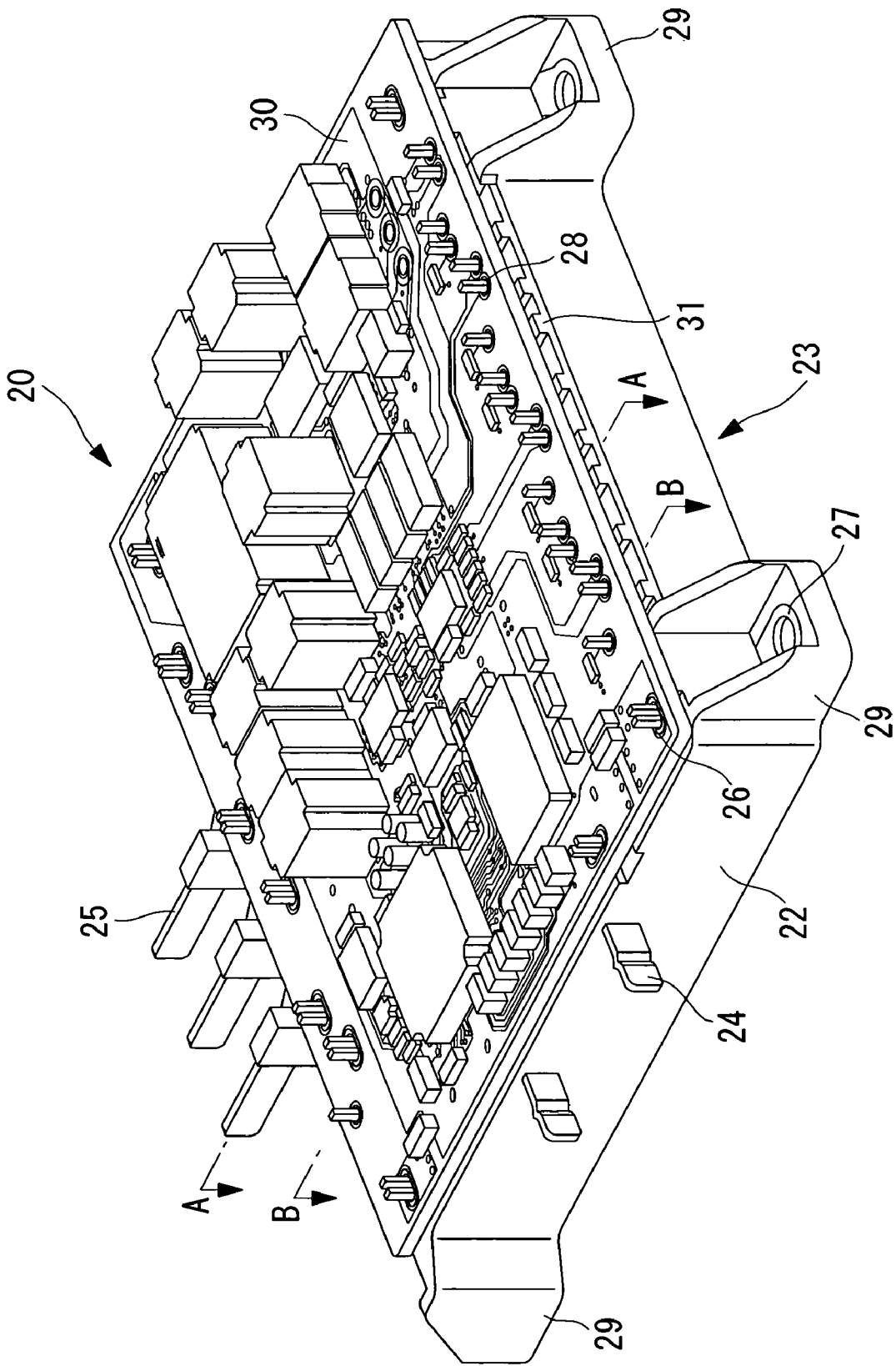
FIG. 2 is a perspective view of an inverter device integrated with the integrated-inverter electric compressor shown in FIG. 1.
Figure 3:
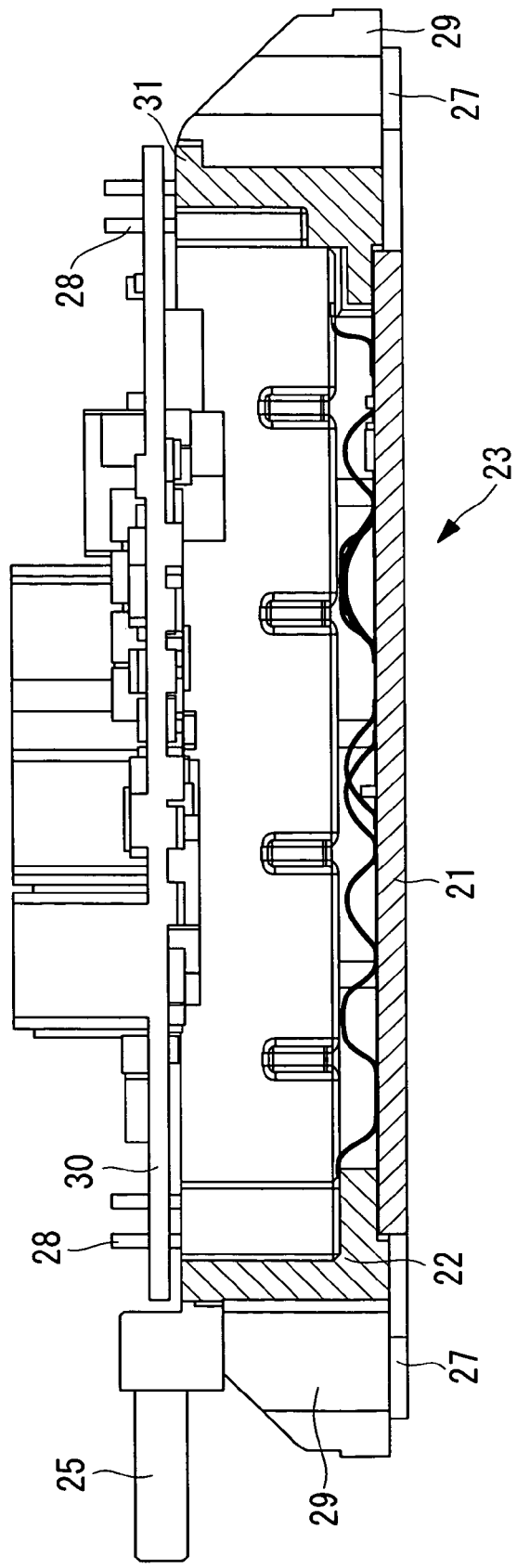
FIG. 3 is a cross-sectional view of the inverter device taken along line A-A in FIG. 2.
Figure 4:
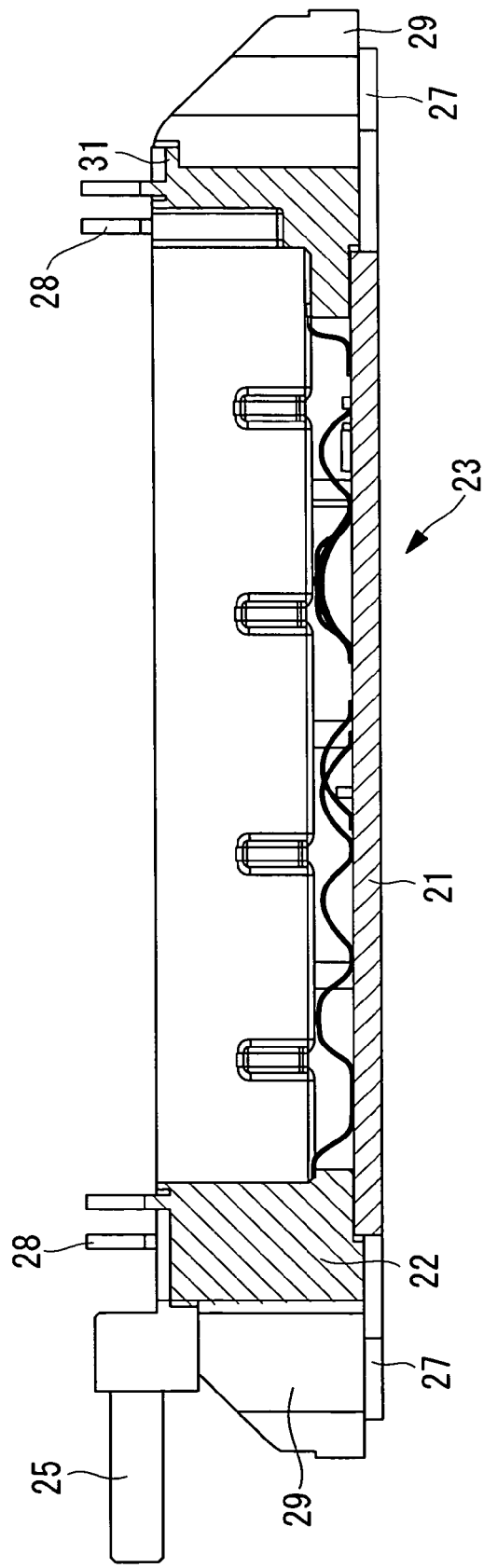
FIG. 4 is a cross-sectional view of the inverter device, excluding the CPU substrate, taken along line B-B in FIG. 2.

An inverter device 20 that converts DC power, which is supplied via a high-voltage cable from an in-vehicle high-voltage power supply unit (not shown in the drawings), a battery, or the like, to three-phase AC power and supplies it to the electric motor accommodated inside the motor housing 3 is accommodated inside the inverter container 9. FIG. 2 is a perspective view of the inverter device 20. FIGS. 3 and 4 are cross-sectional views taken along lines A-A and B-B, respectively, in FIG. 2.

A plurality of semiconductor switching devices, each formed of an IGBT and so on, are mounted in a bare state, and the inverter device 20 includes an inverter module 23 integrally formed by insert-molding a power-related metal substrate 21, made of an aluminum plate, on which a snubber capacitor, a discharging resistor, and so on are mounted, with a resin case 22. The resin case 22 is integrated, by insert molding, not only with the power-related metal substrate 21 but also with P-N terminals 24 connected to the high-voltage power supply, U-V-W terminals 25 that supply three-phase AC power to the electric motor, grounding wires 26, grounding terminals 27, and numerous connecting terminals 28 that connect the power-related metal substrate 21 and a CPU substrate 30, which is described below, and so on.

The resin case 22, which is rectangular shaped, has the P-N terminals 24 protruding from one side along the side surface of the inverter container 9, where the power cable outlets 10 are provided, and has the U-V-W terminals 25 protruding from an adjacent side close to the compressor housing 4. Corner sections of the resin case 22 are constructed by integrating mounting legs 29, which are each secured to the bottom surface of the inverter container 9 with bolts. The grounding terminals 27 through which the bolts pass are provided on the mounting legs 29. By securing the resin case 22 to the bottom of the inverter container 9 with the bolts, the power-related metal substrate 21 and the CPU substrate 30, which is described below, are frame-grounded.

The CPU substrate (printed circuit board) 30, which is slightly larger than the resin case 22, is disposed on the upper surface of the resin case 22 forming the inverter module 23 and is connected with a plurality of connecting terminals 28 and grounding wires 26. A control and communication circuit having a device that operates at low voltage, such as a CPU, is mounted on the CPU substrate 30 so as to control a power-related circuit, which is mounted on the power-related metal substrate 21.

The inverter device 20 is formed by providing the CPU substrate 30 on the upper surface of the inverter module 23. In this state, the inverter device 20 is transported so as to be accommodated inside the inverter container 9. Since the CPU substrate 30 is provided on the upper surface of the resin case 22, someone might directly touch the CPU substrate 30 and/or hold the CPU substrate 30 when transporting or assembling the inverter device 20. To avoid such incidents, in this embodiment, a grip 31 that extends in the horizontal direction is provided integrally with the upper edge of the circumference of the resin case 22. The inverter device 20 can be handled by holding the grip 31.

The grip 31 is provided along almost the entire width of the upper edge of a side surface opposing the side surface of the resin case 22 from which the U-V-W terminals 25 protrude. As shown in FIGS. 2 and 3, the grip 31 extends to approximately the same length as that of the edge surface of the CPU substrate 30, which is mounted on the upper surface of the resin case 22.

According to the above-described configuration of this embodiment, the following advantages are achieved.

DC power supplied via a high-voltage cable from an in-vehicle high-voltage power supply unit to the inverter device 20 of the electric compressor 1 is input to the power circuit of the power-related metal substrate 21 via the P-N terminals 24, is converted to three-phase AC power of a control command frequency by the switching operation of the semiconductor switching devices, which are controlled by the control circuit of the CPU substrate 30, and is then supplied to the electric motor inside the motor housing 3 via the U-V-W terminals 25 and the glass sealed terminal.

In this way, the electric motor is rotationally driven at the control command frequency, and the compressing mechanism is operated. The operation of the compressing mechanism causes the low-temperature and low-pressure refrigerant gas to be drawn into the motor housing 3 from the refrigerant suction port 6. The refrigerant flows toward the compressor housing 4 around the electric motor in the direction of the motor shaft L and is drawn into the compressing mechanism, where it is compressed to a high-temperature and high-pressure state. Then, the refrigerant is discharged outside the electric compressor 1 through the discharge port 7.

During this process, the low-temperature and low-pressure refrigerant gas that is drawn from the refrigerant suction port 6 into the motor housing 3 and flows in the direction of the motor shaft L cools the power-related metal substrate 21 of the inverter device 20, which is disposed in close contact with the bottom surface of the inverter container 9 by the housing wall of the motor housing 3. In this way, heat-generating components, such as the semiconductor switching devices, mounted on the power-related metal substrate 21 are cooled, and their heat-resistance is maintained.

The inverter device 20 is handled by persons and/or robots during transportation and assembly. During these times, the inverter device 20 can be handled by holding the U-V-W terminals 25 on one of the side surfaces and holding the grip 31 provided at the upper edge of the resin case 22 on another side surface. Therefore, it becomes possible to handle the inverter device 20 by neither directly touching the CPU substrate 30, which is mounted on the upper surface of the resin case 22, with bare hands nor holding and lifting the CPU substrate 30.

Therefore, damage caused by holding the CPU substrate 30 and damage caused by the generation of static electricity can be prevented. Since the strength of the resin case 22 can be increased by providing the grip 31, the vibration resistance of the inverter device 20 can be improved. Moreover, the grip 31 only needs to be provided on one side surface of the resin case 22, i.e., the side surface opposing the side surface on which the U-V-W terminals 25 are provided, in order to sufficiently perform its function.

Furthermore, since the grip 31 is provided along almost the entire width of the upper edge of one side surface of the resin case 22, the inverter device can be handled by holding any section in the width direction. Therefore, when holding other side surfaces of the resin case 22, handling becomes easy by increasing the length of the section that can be held. The length of the grip 31 extending in the horizontal direction is approximately the same as the length of the edge of the CPU substrate 30. Therefore, even when the grip 31, which extends in the horizontal direction, is provided at the upper edge of the circumference of the resin case 22, the resin case 22 does not become larger than the CPU substrate 30. Therefore, the size of the inverter device 20 is kept small, while the capacity of the inverter container 9 is maintained.

The present invention is not limited to the embodiments described above, and various modifications may be made within the scope of the invention. For example, the above-described embodiment has been illustrated in terms of an example in which the inverter container 9 and the motor housing 3 are integrally formed. However, they do not necessarily have to be integrally formed, and a separate inverter container 9 can be mounted on the motor housing 3. Furthermore, the compressing mechanism is not limited, and any type of compressing mechanism may be used.

Moreover, the above-described embodiment has been described in terms of an example in which the CPU substrate 30 is slightly larger than the resin case 22. However, an inverter device 20 having a CPU substrate 30 that is the same size or smaller than a resin case 22 may also be employed. The grip 31 is provided only on one side surface opposing the side surface on which the U-V-W terminals 25 of the resin case 22 are provided. However, the present invention does not prohibit mounting of the grip 31 on other side surfaces, and the grip 31 may be provided on other side surfaces when necessary.

What is claimed is:

1. An integrated-inverter electric compressor comprising an inverter container on an outer circumference of a housing accommodating an electric motor and a compressing mechanism and an inverter device, disposed inside the inverter container, for supplying electric power to the electric motor by converting DC power from a high-voltage power source to three-phase AC power, wherein the inverter device includes an inverter module integrating a power-related metal substrate on which a power semiconductor switching device is mounted and a resin case integrally insert-molded with a plurality of terminals, and is provided with a CPU substrate on which a control and communication circuit having a device that operates at low-voltage is mounted on the upper surface of the inverter module, and wherein the resin case is integrated with a grip which extends in a horizontal direction at an upper edge of a circumference thereof.

2. The integrated-inverter electric compressor according to claim 1, wherein the resin case is substantially rectangular, U-V-W terminals for supplying three-phase AC power to the electric motor protrude from a first side surface, and the grip is provided at an upper edge of a second side surface opposing the first side surface.

3. The integrated-inverter electric compressor according to claim 1, wherein the grip is provided along substantially the entire width of the upper edge of the second side surface.

4. The integrated-inverter electric compressor according to claim 1, wherein the length of the grip extending in the horizontal direction is substantially the same as the length of the edge of the CPU substrate.

5. An inverter device integrated, as a module, with an integrated-inverter electric compressor, wherein the inverter device includes an inverter module integrating a power-related metal substrate on which a power semiconductor switching device is mounted and a resin case integrally insert-molded with a plurality of terminals, and is provided with a CPU substrate on which a control and communication circuit having a device that operates at low-voltage is mounted on the upper surface of the inverter module, and wherein the resin case is integrated with a grip which extends in a horizontal direction at an upper edge of a circumference thereof.

* * * * *